United States Patent

Stanton et al.

Patent Number: 5,596,413
Date of Patent: Jan. 21, 1997

[54] SUB-MICRON THROUGH-THE-LENS POSITIONING UTILIZING OUT OF PHASE SEGMENTED GRATINGS

[75] Inventors: Stuart Stanton, Bridgewater; Donald L. White, Morris Plains; George G. Zipfel, Jr., Summit, all of N.J.

[73] Assignee: Lucent Technologies Inc., Murray Hill, N.J.

[21] Appl. No.: 516,368

[22] Filed: Aug. 17, 1995

[51] Int. Cl.$^6$ ................................................. G01B 11/00
[52] U.S. Cl. ........................................... 356/401; 250/548
[58] Field of Search ..................... 356/400, 401, 356/363; 250/548, 237 G

[56] References Cited

U.S. PATENT DOCUMENTS

| | | | |
|---|---|---|---|
| 4,664,524 | 5/1987 | Hattori et al. | 356/401 |
| 4,830,500 | 5/1989 | Kuroki et al. | 356/401 |

OTHER PUBLICATIONS

Burggraaf, P., "Overlay: Lithography's Big Challenge", *Semiconductor International*, pp. 58–61 (1991).

Potenza, G., "Registration Accuracy in Submicron Devices", *Microelectronic Engineering*, 17 pp. 59–88 (1992).

Wittekoek, S., et al., "Deep UV Wafer Stepper with Through The Lens Wafer to Reticle Alignment", *SPIE*, vol. 1264, pp. 534–547 (1990).

Kuo, B. C., *Automatic Control Systems*, 4th ed., Prentice-Hall (1982).

Saleh, B., et al., *Fundamentals of Photonics*, John Wiley and Sons, pp. 800–806.

*Primary Examiner*—Frank Gonzalez
*Assistant Examiner*—Robert Kim
*Attorney, Agent, or Firm*—George S. Indig

[57] ABSTRACT

Through-the-lens alignment during deep UV lithographic processing in the manufacture of VLSI is accomplished without shifting the mask or wafer from the exposure position. Introduction and extraction of alignment light of actinic wavelength depends on beam routing due to diffraction from an interference grating. The path of alignment light is within the focusing system but does not impinge on the focused pattern.

34 Claims, 8 Drawing Sheets

SUB-MICRON THROUGH-THE-LENS POSITIONING UTILIZING OUT OF PHASE SEGMENTED GRATINGS

BACKGROUND OF THE INVENTION

1. Field of the Invention

Projection Imaging.

2. Description of Related Art

In VLSI lithography, poor overlay between the mask levels is one of the main masons production lines produce defective product. See, P. Burggraaf, "Overlay:Lithography's Big Challenge", *Semiconductor International*, pp. 58–61, (Feb. 1991), and G. Potenza, "Registration Accuracy in Submicron Devices", *Microelectronic Engineering*, 17 pp. 59–88, (1992). Often product yield could be increased if more time were spent in alignment, but that would decrease product throughput. A good production line tries to find the most profitable compromise between alignment time and throughput.

In step-and-repeat VLSI production, there are two time consuming steps: the global fine alignment, in which deviations of alignment marks from their ideal locations on the wafer are mapped out before exposure begins; and in stepping from one exposure site to the next, under precise interferometer guidance. When the wafer is stepped to a new site for either alignment or exposure, additional time is consumed waiting for vibrations to dampen out. The time spent aligning and moving from site to site is ordinarily greater than the time spent exposing the wafer.

It would seem that an ideal alignment strategy would be to align at each site just before exposure. However, there may be 50 or more exposure sites on a wafer, and alignment time would be excessive. The normal practice is to move the wafer stage to a number of sites, perhaps 9 or 16, and measure the coordinates of the alignment marks to accommodate wafer distortion, possibly created during a preceding processing step. The computer then maps the wafer, determining where the other alignment marks are expected to be by interpolation. Under interferometer guidance, the wafer is then moved to the first exposure site, the chip is exposed, and then, by dead reckoning and not doing any more alignment, moved to subsequent exposure sites. At present, this strategy is the best compromise between high yield and high throughput.

Scanning systems have similar problems. First, there is a global fine alignment, and then a scan in which both mask and wafer move continuously, both guided by interferometers. The interferometers must keep both the mask and wafer stages in fine alignment during the scan. This often puts restrictions on scan speed due to interferometer limitations in data handling.

Often overlay between levels can be improved with more alignment time. But time spent aligning to improve the yield comes at the expense of total product output. A good production line makes the most profitable compromise between alignment time and throughput.

A much more attractive system would be one in which the exposure and the alignment would be done at the same position, thereby avoiding the step between alignment and exposure. This may be done with a through-the-lens system, in which the alignment pattern is on the lithographic mask and the lithographic projection lens is used to image the mask alignment mark on the wafer alignment mark (or vice versa). This requires focusing the alignment pattern on the wafer and, because of chromatic aberrations, ordinarily requires use of the same light wavelength used in exposure. An unwieldy alternative inserts compensating optics, and avoids resist exposure by using a longer wavelength for alignment.

Several commercial systems use two-position through-the-lens alignment—aligning at a first position at a first wavelength and exposing at a second position with another wavelength. See, *SPIE*, vol. 1264, pp. 534–547 (1990). While assuring accurate sensing at the first position, accuracy at the critical moment is dependent on tracking accuracy—and this with additional expenditure of time.

SUMMARY OF THE INVENTION

Processes of the invention depend on a single-position, through-the-lens, image projection step (of an "object image"). Alignment at the same position as used for projection offers the preferred embodiment of simultaneous alignment-projection.

Initial commercial use is expected to be in fabrication of sub-micron VLSI. Preferred embodiments include on-the-fly exposure, which takes advantage of facility for locking the reticle and water together, and permits exposure with a still-vibrating wafer or reticle.

The alignment system uses principles of co-filed U.S. Pat. No. 08/516,060 Stanton 2-42-2. An image of a reference grating (a "position image") is superimposed on a target grating—one of the two positioning gratings is segmented with segments out of phase with each other—and the resulting light content is measured. In the usual embodiment, positioning corresponds with identical overlap for each of the two segments, indicated as the null point in the difference between two segment-related output currents. A preferred system, "time-multiplexing", measures the two segment values sequentially. Whether sequential or simultaneous, the system is self-referencing.

Single-position through-the-lens facility is due to flexibility in beam routing. Position information is inserted into and/or extracted from the path of the imaging beam on diffracted beams. Basic positioning gratings, are supplemented by carrier gratings—which are responsible for routing. In an illustrative embodiment, lines constituting positioning gratings themselves consist of lines forming carrier gratings.

Use of the invention is likely to take the form of alignment, in which position sensing is accompanied by real time repositioning to move either the target or reference to the sensing null point.

In VLSI fabrication, alignment assures precise superimposition of successive mask levels, and facilitates "stitching" of adjoining image regions—e.g. for construction of object images larger than conveniently provided by conventional scanning/step-and-repeat. Other uses include construction of composite flat panel display images by superimposition or side-by-side projection of transparencies.

Terminology

Grating—Series of parallel lines and spaces, generally of constant period. As with usual interference gratings, line thicknesses and space widths are ordinarily the same.

Object—Pattern to be imaged by projection and to be aligned, e.g. a VLSI reticle (contained on the mask).

Object Image—Image of the object as focused on a target body.

Target—Body on which imaging, both object imaging and position imaging, takes place, e.g. a VLSI wafer.

Reference Mark—A mark, printed or otherwise affixed on the reference, and comprising one or more reference gratings. It is ordinarily contained on a mask, used for forming the projected image on the target.

Signal or Positioning Information—As distinguished from the object, describes information in the reference mark used for position-sensing the object image.

Position Image—The focused image of the signal on the target body.

Position Beam—Light beam emanating from the reference mark and containing position information.

Target Mark—A mark, printed or otherwise affixed on the target, and comprising one or more gratings.

Composite Field—Electric field produced by superimposition of the projected mark on the superimposed mark.

Composite Beam—Beam(s) produced by superimposition of the position image on the superimposed mark e.g. of the projected image of the reference mark on the superimposed target mark.

Segmented Mark—Interference grating constituted of two or more in-line gratings, of the same period, but with segments out of phase with each other (with segments spaced one from the other by a distance unequal to that establishing the period). Good engineering practice requires a phase mismatch of at least 10°. Either or both reference mark and target mark may be segmented.

Time-Multiplexing—By which comparison information corresponding with individual segments of a segmented mark is sampled sequentially (rather than simultaneously).

Carrier or Routing Information—Information contained in a mark serving the sole purpose of routing the emerging beam.

Collinear—Refers to two or more parallel beams—in context of the invention, contemplates overlapping, or even coincident, beams.

Alignment—Act of positioning of the target relative to the reference.

Dead Reckoning—Positioning based solely on measured movement of object and/or target based on a previously measured position.

Theta or θ—Rotation of target mark relative to the position image in the plane of the object image.

DETAILED DESCRIPTION

General

Figure 1:
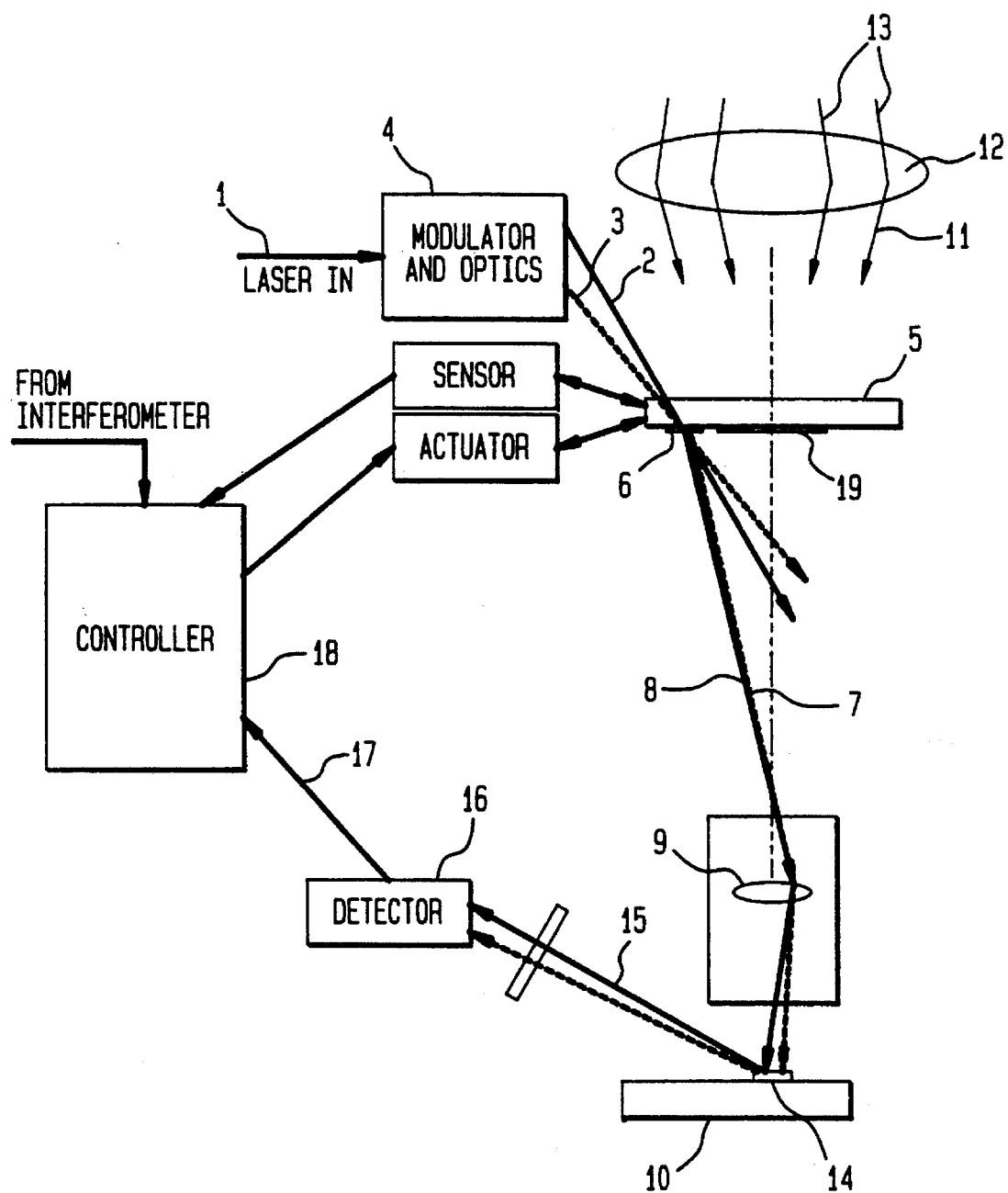
FIG. 1 schematically depicts an illustrative alignment system including feedback.

Processes use principles of the co-filed application. As relevant, non-contacting position measurement is based on comparison of the image of a reference grating with a target grating. The imaged grating and the target grating have the same grating grating period, but one of the two gratings is segmented to produce out-of-phase, in-line gratings, still of the same constant period. In position sensing, one grating is superimposed on the other, and relative overlap for the two segments, is compared. In the usual embodiment, alignment corresponds with equal photocurrents for the two segments.

Principles of the co-filed application are now applied to projection-imaging. Projection of the reference mark via a position beam, precedes or accompanies projection of the image, the "object image", which is to be aligned. Beam routing, used in insertion and/or extraction of the position beam, depends on diffraction. This is accomplished by combining carrier gratings with position gratings—generally by forming position grating lines of higher frequency carrier gratings. The carrier gratings then serve for diffraction-routing of the position beam.

Comparison of segment-related position information may be sequential or simultaneous. A form of sequential comparison, denoted time-multiplexing, avoids inaccuracies introduced by equipment variations. With differentiation, based, e.g. on different angles of incidence, successive diffracted beams containing the information of the individual segments, may be sensed on a single detector. Time-multiplexing is best initiated early in the sensing process—one embodiment uses an acousto-optic modulator to break the illumination source beam into two separate first-order diffracted beams for illuminating the reference mark and generating the position beam.

The process is usefully applied to various forms of imaging—imaging likely including small features—wherever precise positioning is desired. It may be used for creation of composites formed of superimposed images, or produced by stitching of partial images. The objective may simply be display, or it may be used in combination with other processing.

Discussion is of VLSI fabrication—likely to be the initial commercial use. In this use, the object is ordinarily that of a reticle or mask which is imaged on a wafer. Fabrication requires many mask levels which must be aligned to a precision of a fraction of the design rule—likely of submicron dimension. Sensing may be through one or more overlying layers of photoresist or device-functional material so long as a surface relief image of the grating persists, or so long as the beam experiences a transmission or reflection change due to the illuminated grating lines. Signal-to-noise ratio is aided by dependence on diffracted position beams which exit at a different angle than specularly reflected light which can then be discarded. One anticipated use depends on stitching of multiple images in the generation of patterns beyond the practical or economic capability of usual scanning or step-by-step procedures.

The sensing principle, together with feedback, is used in real-time alignment. Circuitry for moving the mask or wafer to a null read-out position based on the output of a photodetector, is known. See, *Automatic Control Systems*, Benjamin C. Kuo, 4th ed., Prentice-Hall (1982). To the artisan, the term "real-time" suggests that positioning is carried our concurrently with sensing. For many purposes, it is considered that the term is satisfied by positioning which lags sensing by no more than ½ second.

Carrier-reference gratings permit precise beam steering, for overlap with target marks in margins or other dedicated regions on the wafer. Grating dimensions are small enough to permit placement in expendable regions on the wafer (e.g. within areas to be lost during diamond sawing in chip separation).

Through-the-lens facility is important for submicron VLSI. An anticipated laser source, the krypton fluoride excimer laser, operates in the deep UV spectrum at a nominal wavelength of 248 nm. Apparatus may continue to use transmission lenses, so that position-sensing beams must be at or near the actinic wavelength for focusing. As design rules are reduced still further, possibly using the argon fluoride excimer laser 193 nm line, reflecting lenses may be substituted. This removes the wavelength constraint.

The inventive process may be supplemented by previous procedures. While single-position—for simultaneously aligning and projection-imaging—is invariably contemplated, additional image positions may be located by dead reckoning. Coarse positioning may be by visual or by other means.

The co-filed application describes process variations which may be useful. An example, is inclusion of an additional grating of different period from a position grating, to enable positioning over distances greater than a grating period. Other gratings may be used for x-y positioning, and satellite beams may be used for z (elevation) information.

The System

FIG. 1 shows the basic system. A laser, a mercury arc, or other suitable source emits an alignment beam 1, which, in the apparatus shown, is converted into two or more beams 2 and 3 by a modulator 4, e.g. an acousto-optic deflector. Beams 2 and 3 alternate at a high repetition rate, e.g. at 10 kHz. Beams are usually coherent, but under some circumstances, are desirably made partially incoherent. Modulator 4 includes optics for directing beams 2 and 3 to the desired area of mask 5.

Light beam 1 is desirably continuous, but may be pulsed at a high repetition rate—e.g. several thousand per second. In 248 nm lithography, the low pulse-rate of the krypton fluoride excimer laser light source used for patterning is undesirable for alignment. It has been replaced by a frequency-doubled 496 nm cw Argon laser. (The frequency-doubled 496 nm emission line is sufficiently close to the 248.2 excimer KrF laser line.)

Beams 2 and 3 alternatively illuminate reference mark 6. (The single grating shown on the drawing is representative of the various embodiments—those in which the reference mark is constituted of one or more single of interleaved gratings for arranging, or for x-y and θ-aligning.) Angle-of-incidence φ on the surface of mask 5 is, for the through-the-mask embodiment, likely in the range of 10°–15° as measured from the direction normal to the mask. Mark 6, illustratively of grating period 2.5–6 μm, is designed to yield one pair of collinear first-order beams at an emergence angle $\phi_{out}$ out in the range of 5° to 6°, again measured relative to an orthogonal beam. Zeroth order beams, continue along the paths of incoming beams 2 and 3 and are rejected. Two other first-order beams are also rejected.

The angles of the beams and the periods of the diffraction gratings in the mask are such that one diffraction order from the beam, marked +45°, is collinear with one of the diffraction orders from the beam, labeled −45°. These two collinear beams 7 and 8 which alternate in time and carry reticle position information, are passed through lens 9 and focused on wafer 10.

Pattern 19 is illuminated by rays 11 emerging from condenser lens 12. For 248 nm lithography, incoming illumination beam 13 may be the pulsed output of a KrF excimer laser.

Beams 7 and 8 pass through a peripheral region of lens 9, ultimately to produce a composite field in combination with the target mark.

(Gratings and grating positions are chosen to direct third- and higher-order diffraction beams outside of the lens system. The usual diffraction grating, with equal lines and spaces, avoids second order diffraction beams, which are not so easily differentiated on the basis of emergence angle. The system does not preclude use of a varying line-space grating, which does not inherently cancel second-order diffraction beams.)

Diffraction angles are determined in accordance with:

$$\sin\phi_{in} + \sin\phi_{out} = \frac{n\lambda}{a} \tag{1}$$

in which
$\phi_{in}$=angle of incidence of incoming beam
$\phi_{out}$=angle of emergence of diffracted beam
n=diffraction order
λ=vacuum wavelength
a=grating period.

The equation is valid for transmission or reflection. In order to make beams 7 and 8 collinear, values of $\phi_{in}$ are chosen to make $\phi_{out}$ the same for the two beams.

Target mark 14, in this instance contains a high frequency carrier grating providing for extraction of composite information by way of first-order diffraction beams 15. With beams 7 and 8 incident on wafer 10 at angles-of-incidence $\phi_{in_7}$ and $\phi_{in_8}$, beams 15 emerge at equal angles of emergence $\phi_{out}$, calculable from Eq. 1 for n=1.

Upon emerging, alignment beams 15, now containing composite image information produced by superimposition of the reference mark image and the target, are made incident on detector(s) 16. (As discussed in conjunction with FIG. 2, there is some advantage in providing separate detectors for satellite beams for focusing.) Output current 17 produced by the detector is sent to computer 18.

For time-multiplexing, the currents vary at the modulation rate. The photo currents are $I_{+45}$ and $I_{-45}$ (from the +45° and −45° beams, respectively)—are equal when the mask and wafer marks are aligned, and with difference in intensity proportional to the degree of misregistration.

Figure 2:
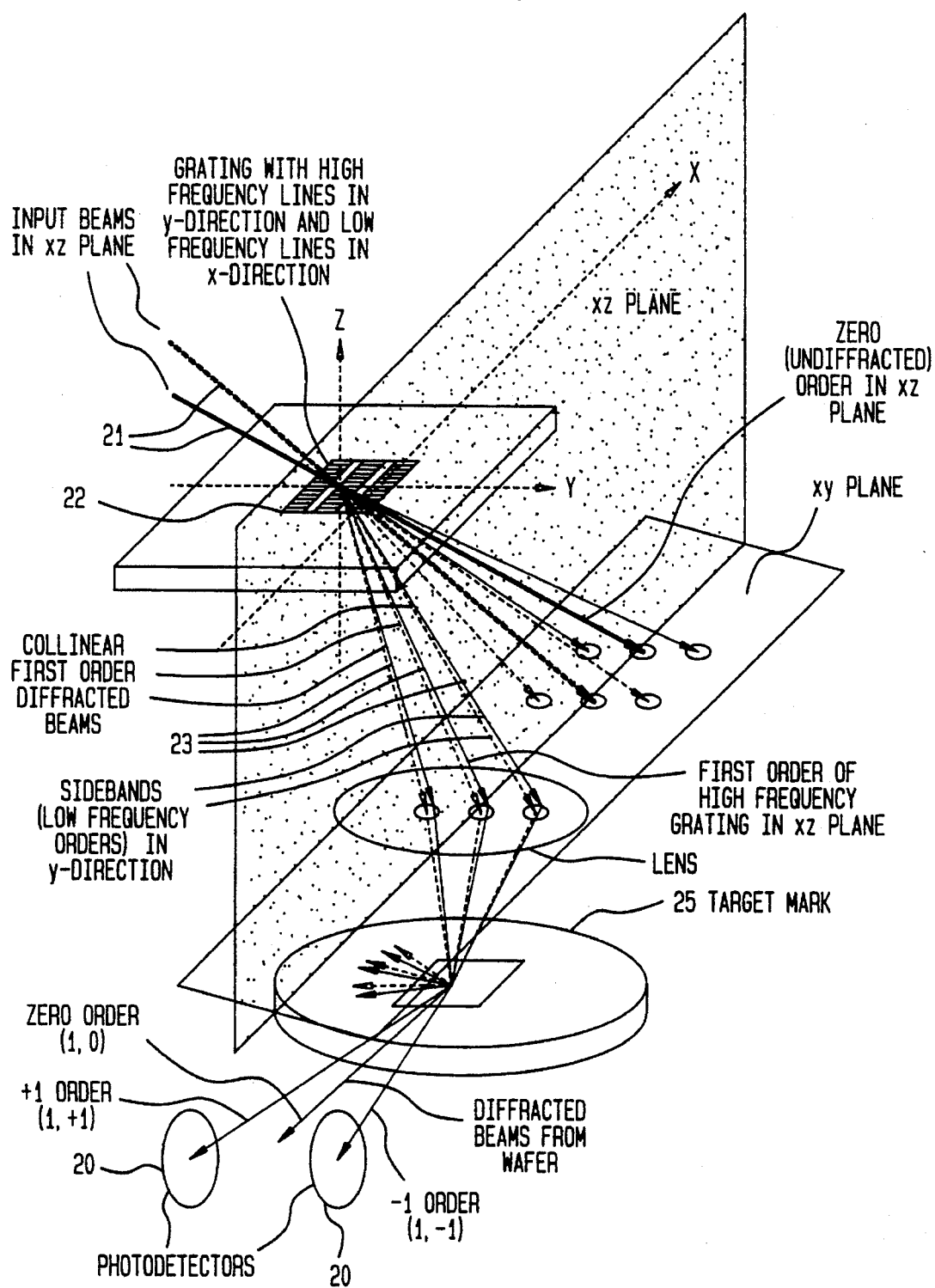
FIG. 2 is a detailed view of a system illustrating creation and selection of zero-order and first-order diffracted beams used in beam-steering.

FIG. 2, which may be regarded as an orthogonal detailed view of FIG. 1, illustrates use of multiple photodetectors 20 (together represented by detector 16 of FIG. 1). Account is taken of the (relatively small) diffraction by the low frequency (position) grating so that a first-order diffraction beam 7 or 8 upon striking target grating 14 produces several diffracted beams. One first-order diffraction beam (1,0) is the product of the high-frequency (carrier) gratings, alone. Two others are diffracted simultaneously by the carrier and position gratings, producing satellite beams (1,1) and (1,−1).

In FIG. 2, separate photodetectors are provided for detecting each of the two satellite beams.

FIG. 2 is otherwise analogous to FIG. 1. Input alignment beams 21 strike reference grating 22 to result in capture of three pairs of collinear first-order diffracted beams 23 which, upon passing through lens 24, are focused on target mark 25 to result in superimposition of images of reference mark 22 produced by the three first order diffracted beams.

Usually the (1,1) and the (1,−1) modes have a better contrast and signal-to-noise ratio than the (1,0) mode. Sometimes only a single photodetector for either the (1,1) or 1,−1) modes is all that is needed. However, if the system is not in focus, the (1,1) and the (1,−1) are not equal, and a second detector yields additional positioning information. (See discussion of R functions in the description of FIG. 6.)

Usually three separate alignment measurements will be made, one each in x and in y and a third in either x or y. This yields six pieces of information, misalignment and focus at three locations. The three misalignment measurements allow the controller to compute misalignment in x and y and the magnification deviation. The three focus measurements at three locations gives focus in the center plus the tilt of the wafer plane about the x and y axes.

Principle of Operation

Figure 3:
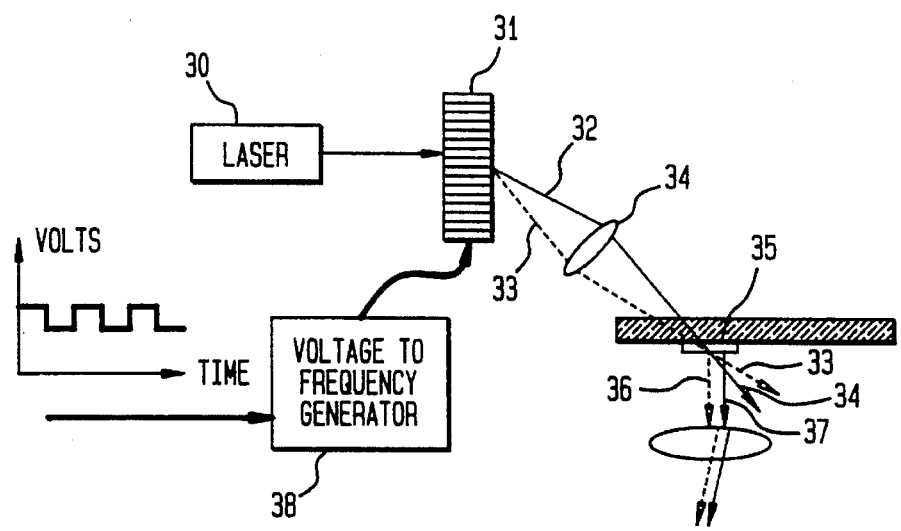
FIG. 3 shows an arrangement providing time-multiplexing.
Figure 10:
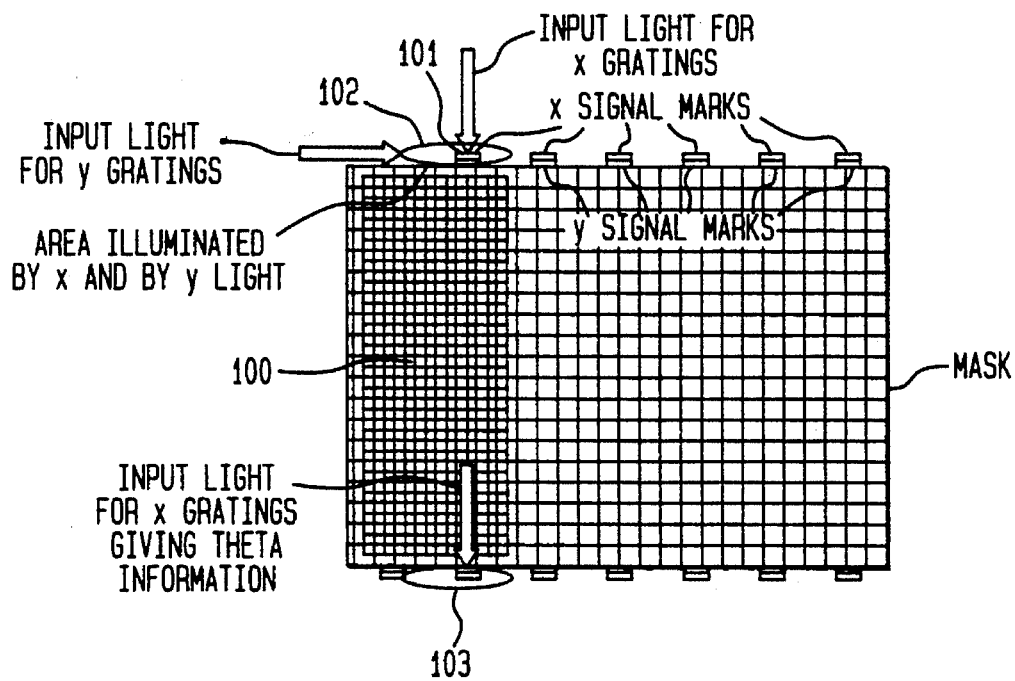
FIG. 10 shows a similar reticle but with reference marks providing for scanning.

FIG. 3 illustrates one means for time-multiplexing. A laser beam emitted from laser 30 is incident on modulator 31—in this instance, an acousto-optic deflector—which produces alternating beams 32 and 33. The two beams are focused by lens 34 so that each illuminates both segments of segmented reference mark 35. In addition to zeroth order beams (transmitted extensions of beams 32 and 33) each is accompanied by two first-order diffraction beams. Reference mark segment lines are, themselves, short period "carrier" gratings, which, as discussed in description of FIG. 10, are of differing period. Large angle input beam 33 is diffracted by the shorter period carrier grating to produce diffracted beam 36. Beam 32 is diffracted a lesser amount by the longer period carrier grating, thereby resulting in beam 37 of the same emergence angle as beam 36. The collinear, time-multiplexed reference beams 36 and 37 are focused on the target. (Zeroth order and unused first order beams are discarded.)

Operation of an acousto-optic deflector is described in *Fundamentals of Photonics*, B. Saleh and M. C. Teich, John Wiley and Sons, pp. 800–806. The divergence angle between the two emerging beams is proportional to the acoustic frequency generated by a piezoelectric transducer in response to an incoming square-wave voltage.

The magnitude of the deflection is determined from the relationship:

$$\sin \phi_{out} = \sin \phi_{in} \pm \lambda f / v \quad (2)$$

in which
$\phi$=deflection angle
$\lambda$=the wavelength of the laser light
$f$=frequency of the acoustic wave
$v$=velocity of sound in the piezoelectric element.

The acoustic wave alternates between first and second frequencies $f_1$ and $f_2$, thereby producing two diffracted beams, which are steered and shaped to strike the reticle at angles of $\phi_{in+}$ and $\phi_{in-}$.

An acousto-optic reflector is a versatile instrument. It can be used to generate simultaneous beams by concurrent use of two or more modulating acoustic waves at differing frequency. The power of the generated beams may be varied in time, by modulating the acoustic wave amplitude.

Figure 4:
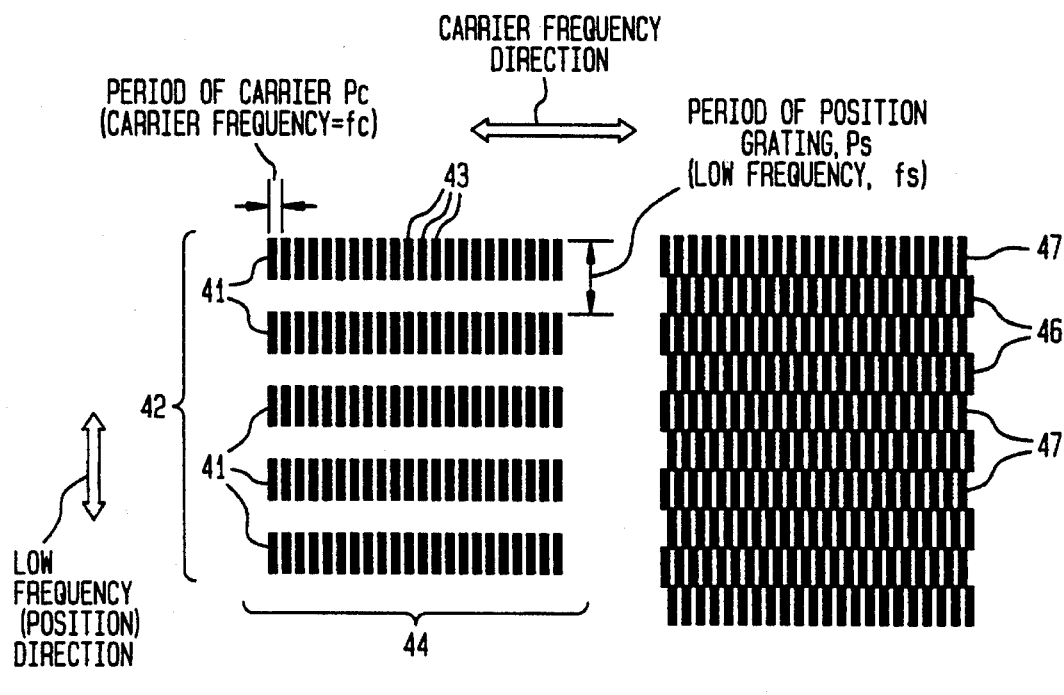
FIG. 4 shows two forms of high-low gratings.
Figure 5:
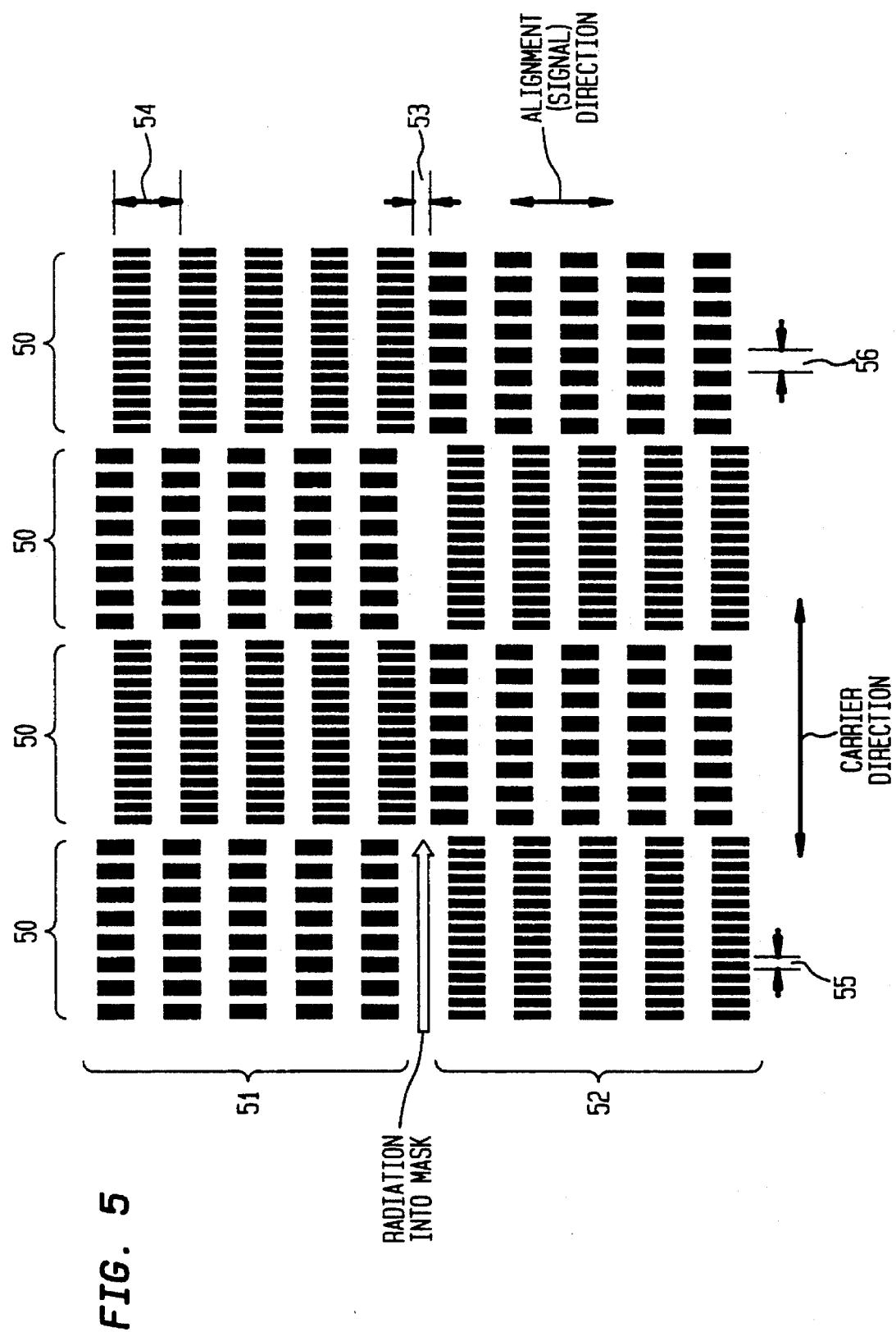
FIG. 5 is an illustrative interleaved reference grating.
Figure 6:
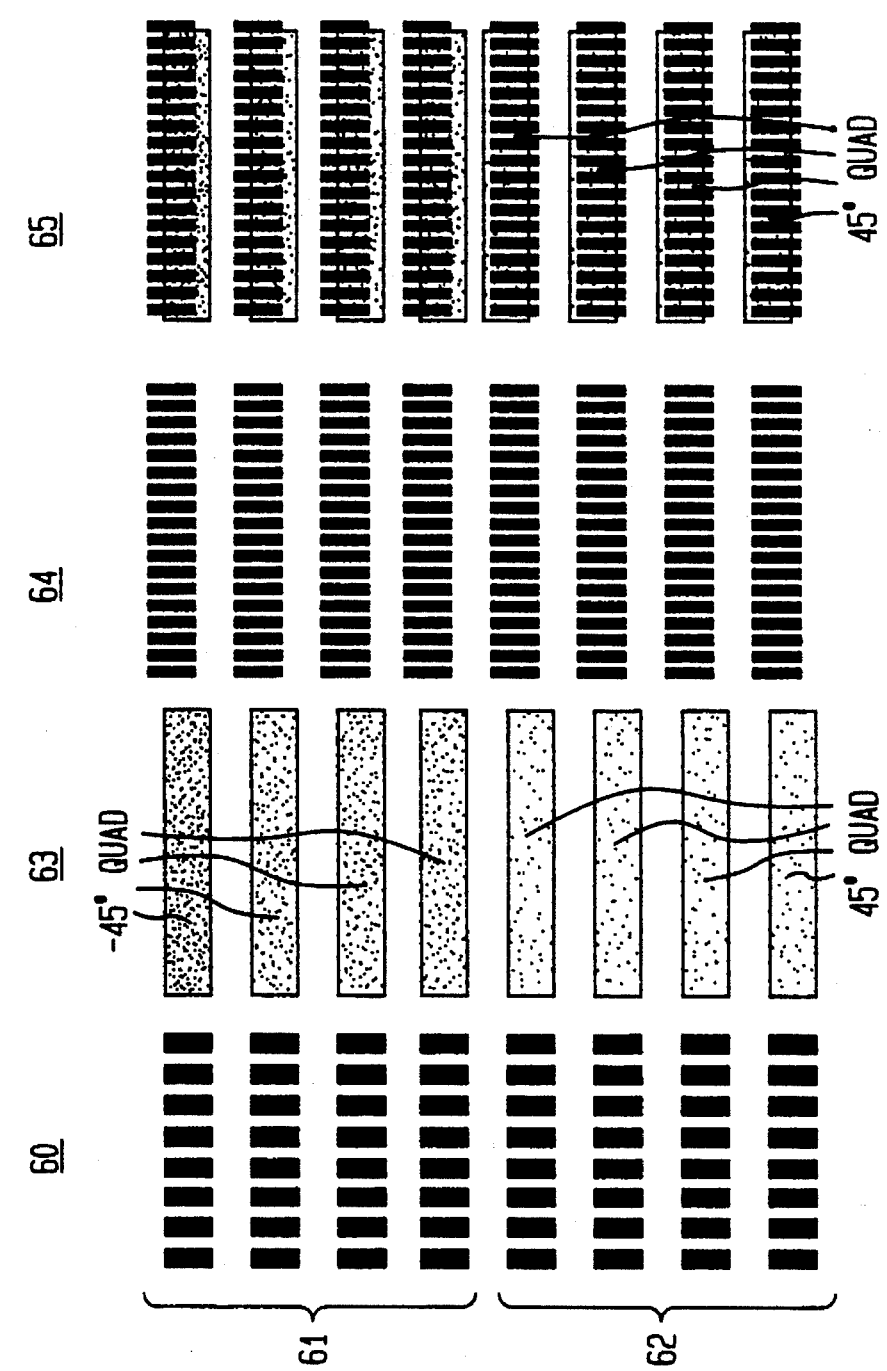
FIG. 6 shows reference and target gratings together with resulting superimposed image.

FIGS. 4–6 relate to grating design. In description of these figures, and elsewhere in the description, alignment illumination is considered to be coherent. A coherent beam has maximum depth of focus, high signal-to-noise ratio, and can be filtered precisely. There are circumstances, however, under which it is desirable to reduce the coherence of the laser light by use of diffusers or other optics. Partial incoherence averages perturbations in the beam path caused by air turbulence or other non-uniformities between the reference mark and the target.

All of FIGS. 4–6 are illustrative of the preferred embodiment using carrier gratings in the reference mark, and generally in the target mark as well. Accordingly, as shown, low period grating lines themselves consist of high frequency (or carrier) gratings. This form of the invention offers flexibility in path design, both for introducing and extracting information from the system, and, significantly, for generating collinear, time-multiplexed beams. Since the generic invention does not require carrier gratings on the target, target gratings may be viewed as consisting of continuous grating lines. As dependent on low-frequency gratings only, introduction of information from the system may be based on simple transmission as through a transparent reticle or by reflection. Introduction into or extraction of the alignment beam from the image projection path may use mirrors or prisms.

Gratings depicted are of the familiar form of a conventional interference grating—of nominally equal lines and spaces. In general, this is preferred, with any substantial deviation producing "dead spots"—regions in which detected intensity is insensitive to adjustment. There may, nevertheless, be circumstances where deviation serves a particular purpose.

Alignment grating periods may vary greatly, depending on use. With long working distances—long distances between the head and the target—it may be convenient to magnify the projected image, and $P_s$ may be from 10 to 100 μm. In systems with small working distances, $P_s$ may be smaller—a few microns or less. Factors, such as capture range, influence choice of $P_s$. Carrier grating period, $P_c$, is chosen for yielding the desired path route and for creating collinear beams, in accordance with Eq. 1. For general discussion, see *Diffraction Physics*, North-Holland Publishing Company, pp. (1981).

FIG. 4 shows the simple "crossed grating" 40, constituted of five grating lines 41, together forming the long period "signal" grating 42, of period $P_s$ (or frequency, $f_s=1/P_s$). Long-period grating lines 41 are composed of short period grating lines 43 forming carrier gratings 44, of period, $P_c$ and frequency, $f_c$. Variation from the prototypical arrangement discussed (constant $P_s$ and $P_c$ may accomplish a number of purposes. By varying the pitch of the signal grating—by varying the line-to-line grating, the signal grating is effectively encoded, so that a particular value of composite field is obtained only with complimentary variation of the target grating. Varying pitch in a single (or all) carrier grating may serve a similar purpose. By varying the (constant) pitch of adjacent carrier gratings, it is possible to bring their associated signal components to a confined region—e.g. for onto an optical fiber transmission system.

An alternate "zero-pi" grating 45 is also shown. It is similar to grating 40 but includes additional carrier gratings 46 between long period grating lines 47. Three additional carrier gratings 46 are 180° (i.e. pi radians) out of phase with carrier gratings forming the low-period grating lines 47. Zero-pi gratings make more effective use of illumination and form an image of twice the signal frequency. They may be substituted for simple gratings wherever shown or discussed.

In FIG. 5, the reference grating is shown as segmented. In principle, the fundamental requirement of position sensing is satisfied as well by a constant phase reference grating in combination with a segmented target grating. A segmented reference mark offers some convenience in information management—e.g. in offering collinear segment-by-segment reference beams for formation of the composite image—and is generally preferred.

The figure shows a reference mark made up of a multiplicity of grating patterns interspersed in a checkerboard array. The generic advance requires only a single low-frequency grating. The purpose of interleaving relatively small grating segments—small relative to illuminating beam cross section—is to average out non-uniformities in beam intensity. Position detection critically depends on comparison of the two segments and requires lighting uniformity. Depending on needed alignment accuracy, a single grating may suffice.

Patterns in FIG. 5 consist of low-frequency grating, all of period $P_s$, which for the preferred embodiment shown are made up of grating lines constituting, high-frequency carrier gratings. Four signal gratings 50 are shown. (In practice, segments would usually contain tens of grating lines.) Each signal grating consists of two segments 51 and 52. Signal grating segments, while of the same grating period, are out of phase with each other. In the example depicted, the gap spacing 53 between segments is alternately one-quarter and three-quarters of the signal grating period 54. By this means, the illustrative 90° phase mismatch is maintained in the same direction for successive gratings (exiting illumination is of the same phase for all of the "black squares" of the checkerboard) so that mismatch intensities add in each of the two directions. It is convenient to regard segments as shifted from a central, in-phase norm, so that segments are considered as either −45° or +45° (for the example of a 90° phase shift).

Carrier gratings differ for the two signal grating segments. Periods are designed to produce parallel (collinear) signal-carrying beams, with each pair containing one first-order diffracted beam from both segments.

In time multiplexing, segments 51 and 52 may be simultaneously illuminated by laser beams that alternate in time and strike at two distinct angles $\phi_{in+}$ and $\phi_{in-}$ since unwanted beams are rejected. (In FIG. 3, the corresponding beams 32 and 33 are directed by modulator 31.) Both alternating beams strike the entire reference pattern—both segments with equal averaged intensity.

The angles of the beams diffracted by the carrier gratings are as follows.

For angle of incidence $\phi_{in+}$:

$$\sin(\phi_{a\pm}) = \sin(\phi_{in+}) \pm \lambda/P_{c+} \qquad (3)$$

For angle of incidence $\phi_{in-}$:

$$\sin(\phi_{b\pm}) = \sin(\phi_{in-}) \pm \lambda/P_{c-} \qquad (4)$$

Accordingly, incoming beams of angles $\phi_{in+}$ and $\phi_{in-}$ create four separate first-order diffracted beams, $\phi_{a+}$, $\phi_{a-}$, $\phi_{b+}$, and $\phi_{b-}$. Input angles and grating periods 55, 56 are selected so that one of the two first-order beams diffracted from segments of carrier period 55 are collinear with one of the two first-order beams diffracted from segments of carrier period 56, e.g. so that $\phi_{a-} = \phi_{b-}$.

The collinear diffracted beams combine to produce a single reference beam which takes the same path to the signal target, and is then diffracted as a unitary composite beam. Identical paths assure identical diffraction efficiency and other routing influences (such as reflectivity) are uniform. Since the alternation frequency may be substantial, e.g. 10 kHz, the system is kept from drifting. Long-term variations in the collinear beams are canceled out.

In a useful arrangement, only the two collinear beams, e.g. $\phi_{a-}$ and $\phi_{b-}$ are retained in the system. The zeroth order beam and other diffracted beams are apertured out by proper selection of carrier frequencies and angles of incidence. If aperturing at the reference mark is impractical, any extraneous beam may be filtered out further along the beam path.

FIG. 6 shows the principle of operation ("quadrature"). Four patterns are shown. Pattern 60 is a reference mark consisting of simple grating segments 61 and 62. Carrier gratings of the two segments may be of differing period to produce collinear first-order diffracted beams. Pattern 63 is the aerial image of mask grating 60. Extraneous beams have been stripped and do not participate in image reconstruction, so that the aerial image lines are solid. Target pattern 64 is of the same period as that of the aerial image, but is not segmented. It consists of eight equally-spaced grating lines. Since, in the usual embodiment, composite information is to be sensed by a single detector, carrier grating periods are equal—yielding constant angle of emergence. (There is no required relationship between the carrier frequencies of the target and reference marks—they are independently determined to deliver desired paths.)

Composite pattern 65 shows the target pattern 64 with superimposed aerial image 63. As depicted, the composite mark represents alignment for the usual null, rather than gray-scale, system. Aerial images of the +45° segment and of the −45° segment overlap halves of the target pattern by an equal amount. If the target moves out of alignment, the diffraction powers of the two exiting beams will differ. (If the target moves up, the power from the +45° segment will increase.)

Since, in time multiplexing, the two segments are sensed alternately, the photodetector output is seen as an alternating change in photo-current. By demultiplexing—by separately measuring the two current components, $I_{+45}$ and $I_{-45}$—both alignment and direction of misalignment may be determined. The mount of misalignment is the absolute value of the difference between the two currents—the direction of misalignment is the sign of the difference. This may be expressed as the function, R:

$$R = \frac{I_{+45} - I_{-45}}{I_{+45} + I_{-45}} \qquad (3)$$

The R function is self normalizing, i.e. changes in laser power do not change the value of R. R equals zero at alignment. Otherwise, the sign and magnitude of the finite value characterizes the misalignment. The R function has proved to be very robust under many conditions in both computer simulations and in experimental tests.

The beams diffracted from the target contain a central first-order beam (1,0) plus two or more sidebands, similar to the (1,−1) and (1,+1) modes shown in FIG. 2. These sidebands also contain composite field information, and it is usually preferred to use these modes rather than the central mode. The two satellite modes are not perpendicular to the target, so that the apparent position varies if not in focus. By adding the R functions of the two satellite modes, any differences average out, i.e., $R=(R_{+1}+R_{-1})/2$, so that if both sidebands are used, exact focus is not required. In addition, since the R functions for the satellites vary with z-direction, the difference $R_{+1}-R_{-1}$, can be used to measure extent of defocus, or z-position.

The quadrature principle applies unchanged to an embodiment in which segmented marks contain more than two segments. The small loss in position-dependent slope of intensity is offset by more uniform sensitivity to position adjustment. A two-segment mark provides accurate position information for about three-quarters of a period, but the slope of the R function is small, approaching zero in regions of the remaining quarter. Using a three-segment mark, with the three segments, respectively, +60°, 180° and −60° out of phase with the target grating, and with a time-multiplexed beam divided into three collinear beams, three R functions are defined. By using individual R functions successively, so that those of zero slope are successively ignored, accuracy is maintained over target displacement of the entire period.

Figure 7:
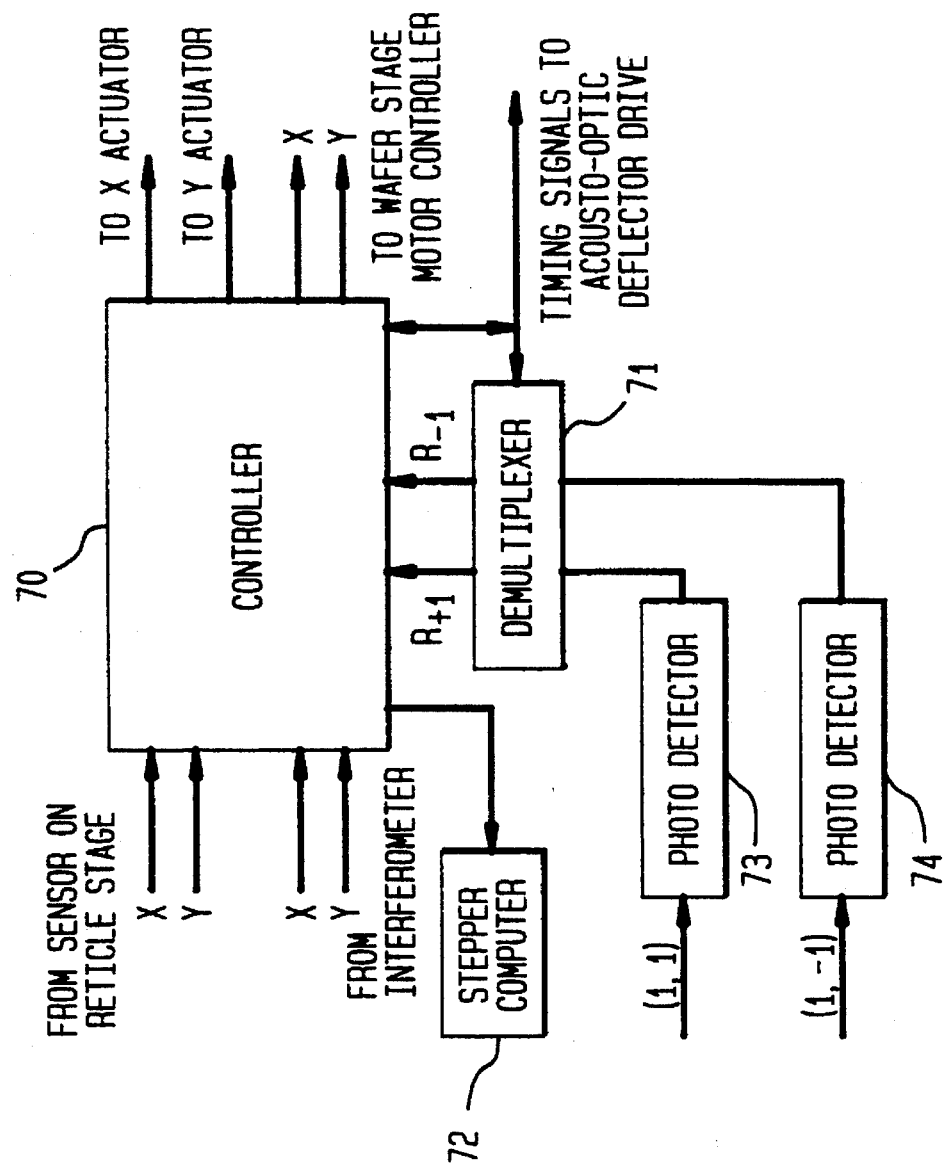
FIG. 7 is a block diagram of a controller showing operation of an illustrative alignment system.

The block diagram of FIG. 7 shows an illustrative system. For the particular system shown, computing function is divided among three computers, controller 70, demultiplexer 71 and stepper computer 72. The diagram provides for coarse adjustments independent of carrier gratings. Illustrative sensors and controllers for coarse adjustment during stepping are discussed in the description of FIG. 8.

Two photodetectors 73 and 74 sense first-order diffracted satellite beams. The two outside-positioned photodetectors 20 of FIG. 2 perform that function. The system of FIG. 7 could include the center photodetector 20 and make use of the (1,0) mode as discussed in that figure. Electrical outputs from the detectors are introduced into demultiplexer 71 which separates segment-derived information on the basis of timing signals used for initial time-division—e.g. for controlling the acousto-optic deflector 31 of FIG. 3. R functions are computed by demultiplexer 71 and sent to controller 70. The function is used in combination with sensor signals from sensors on the reticle stage to determine the magnitudes of corrective signals to be sent to the reticle actuators. Paired x- and y-sensors and actuators are shown. The controller is responsible also for coarse positioning—in this instance, conducted during stepping. Interferometer signals, again for x- and y-sensing are processed by the controller, and are sent to wafer stage motor controllers and to the stepper computer. The controller may be responsible for other system functions, such as switching the actinic light on and off, and for guiding the system, e.g., to maximize throughput.

An electric current proportional to the R function is sent to the reticle actuators which quickly move the reticle to a position that improves alignment and minimizes error. The reticle stage is constructed so that it can be moved rapidly without exciting vibrational modes.

Error signals may be sent directly to the wafer stage. In retrofitting an old machine it is often less costly to apply the corrective signals to the fine wafer stage, and this may compensate for loss in response speed.

Repositioning the mask closes the feedback loop. The speed at which this occurs depends on the bandwidth of the system, specifically the data sampling rate, which is proportional to frequency of the time multiplexing, and the time response of the reticle stage. Accuracy depends on the signal-to-noise ratio of the error signal from the detector and the period of the alignment gratings The signal-to-noise ratio can be increased by time averaging, with some loss in response speed.

Controller 70 receives information from the detectors and converts it into commands, e.g., for x- and y- and possibly z-, θ, magnification, and tilt correction. There are two R functions for each mark for systems based on paired sideband detection. Corrective error signals, taken from the R functions, are sent to the actuator drivers that move the mask stage or the wafer stage. During stepping the system may be under control of an interferometer which keeps it within the dimension of an individual grating period. Alternative arrangements include use of supplementary gratings of differing period. Once within the capture range, the basic positioning feedback system is turned on and the reticle and wafer are locked together.

Figure 8:
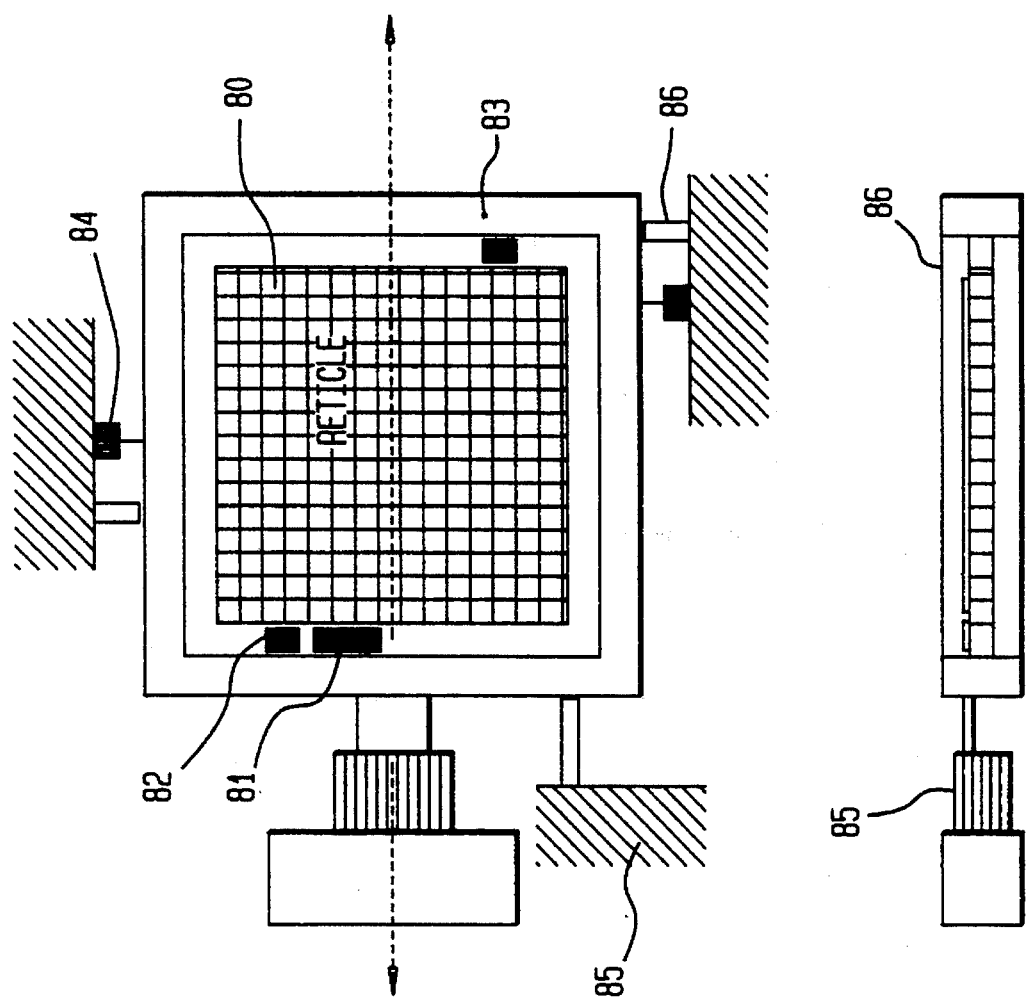
FIG. 8 is a reticle holder providing for x, y, and θ positioning.

FIG. 8 includes plan and front elevation views of a reticle stage. Reticle 80 is provided with y alignment mark 81, x alignment mark 82, and an additional x alignment mark 83 used for θ and magnification measurements. Piezoelectric elements respond to feedback signals to correct for misalignment—element 84 for y-direction, 85 for x-direction and additional y-direction element 86 for θ correction.

The wafer, when moved to a new exposure site, experiences vibrations. For the apparatus shown, vibrations are primarily in the x-direction. For exposing while vibrating, "on-the-fly", the x-direction actuator shown is larger than the others.

Usually the controller sends an error signal and the actuators reposition the reticle to improve alignment. Sometimes, e.g., just before an exposure begins, the control signal repositions the reticle to a location where it can capture the wafer stage as it passes by. By intercepting the wafer stage while it is still moving into position it is possible to begin exposure sooner.

The motion is provided by piezoelectric or electrostrictive actuators that push or pull along the x or the y axis. The reticle stage is designed to be stiff so that it will resonate only at high frequencies which are not excited by the actuators. The actuators are attached to a countermass, so that when they expand or contract, the center of mass of the whole system does not move. This reduces vibrations further.

The actuators are fast and apply considerable force. Thus they can move a large mass quickly and stop quickly.

There are sensors attached to the stages that give approximate x and y positions. They become important when the reticle stage is no longer locked to the wafer via the feedback loop, such as when the reticle stage is being positioned to start a new exposure. This coarse sensor information is also fed to and processed by the controller.

The mask stage for a step and repeat camera is shown. In a scanner the reticle stage must be capable of moving a distance somewhat greater than the size of the reticle. Thus the reticle stage includes a coarse stage with long travel in the x and y directions similar to that of the wafer stage.

Figure 9:
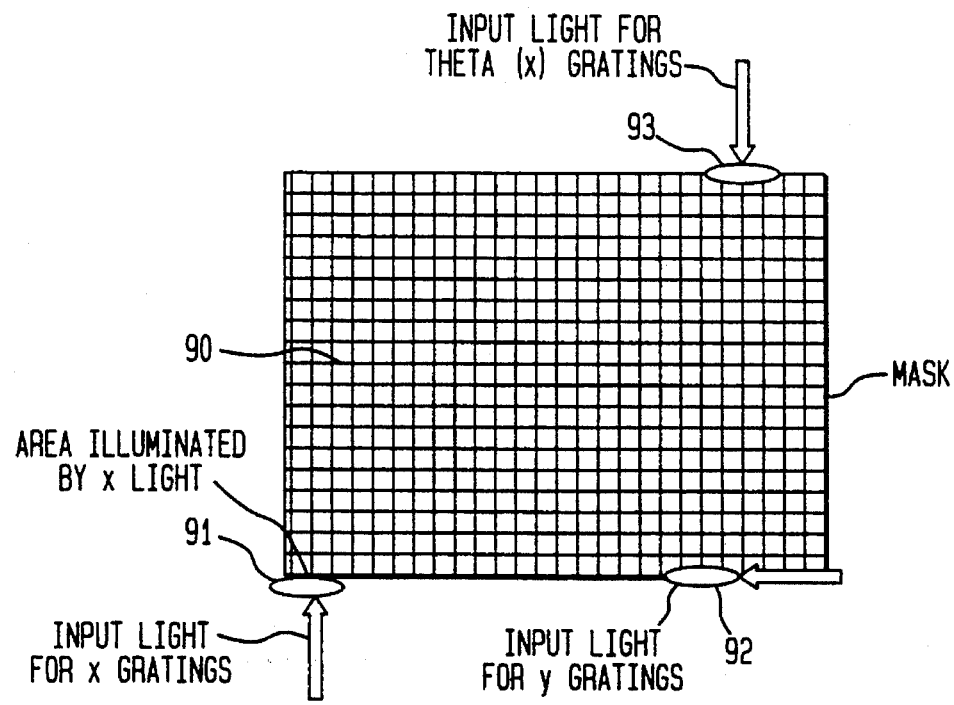
FIG. 9 shows a reticle with x and y reference marks arranged for stepping.

FIGS. 9 and 10 show reticle marks arranged for step-by-step and scanning respectively. In FIG. 9 mask 90 is provided with three marks: mark 91 for x-positioning; mark 92 for y-positioning; and additional x-mark 93 for θ-positioning. The large separation between the two x marks permits sufficient rotation computation (required θ correction is equal to $(\delta x_1 - \delta x_2)/(x_1 - x_2)$), where $x_1$ and $x_2$ are the positions of the x-marks. The z-information from the three marks yield average z-position together with a measure of tilt about the x- and y-axes.

In FIG. 10 hash region 100 represents an instantaneous illuminated area during scanning. Positioning is dependent on x and y marks 101 and 102 of the series of alternating marks (shown as at the top of the mask) together with one additional x mark 103, at the bottom of the mask. As depicted there are sufficient marks so that at least three are illuminated for every instantaneous position. One alternative is continuous markings extending along the entirety of the mask. Another is use of dead reckoning for a part of the scan.

The inventive process is conveniently used for stitching. A stitcher may operate step-by-step or by scanning.

Stitching has many advantages. If alignment can be done with sufficient accuracy and speed, it permits use of a smaller, less expensive projection camera with better imaging properties. The size of the chip is limited only by the size of the mask, not the size of the projection camera's field. Thus very large chips are possible. It is even possible to use several different masks to make a single very large chip. There are other technologies, besides VLSI, that require large, lithographically-produced patterns, and may gain from stitching. Modern display panels are many inches in each direction and may soon require features that are only a few microns in size.

Variants

Description has been of embodiments having mathematically precise discontinuous change in grating period and other design parameters. Discontinuous changes are often desirable, but may not be easily achieved. Grating segmentation may be more gradual, with spacing approaching the desired phase change over two or more periods of each segment, with little harmful effect. The same is true of grating period changes, so that, for example, the effect of multiple, in-line gratings for, together, enabling positioning over dimensions exceeding a single period, is substantially preserved by less abrupt variation.

There are instances in which a deliberate gradual rather than abrupt change is desirable. Phase change between interleaved gratings in a zero-pi design, may usefully follow a sinusoidal or other relationship. Analogous to signal processing in radar systems, this may improve signal-to-noise ratio.

Alignment usually contemplates relative positioning as between superimposed or adjacent levels. The fundamental procedure, however, depends on alignment of each individual level, ordinarily relative to a single target mark or to related target marks. Accordingly, level-to-level alignment operates through multiple individual alignments. Claims contemplate alignment of an individual object/target pair as well as of multiple pairs.

It has been useful to consider the detected light field, produced upon superimposition of the position image on the target mark, as taking the form of a (focused) image. For most purposes, this is not required—the field intensity to be measured does not require imaging. The text should be interpreted accordingly. There are instances in which focusing is useful, e.g. where field information is to be introduced onto a fiber end or other confined area.

The invention is applicable to an alternate form of pattern delineation. In "proximity" printing, a 1:1 image uses a reticle end wafer in near-contact (with spacing only to prevent damage). Darkfield imaging, using beams routed by carrier gratings, continues to improve signal-to-noise ratio. It is most useful for the composite beam. A likely embodiment provides for reflection of the diffracted composite beam off the incident surface of the wafer, so that it again passes through the reticle and thence to the detector. A contemplated embodiment provides for the reflected beam passing through a dedicated (clear) region of the reticle to avoid the complexity of secondary diffraction.

The use of combined signal-carrier gratings is fundamental to the invention. Embodiments discussed have consisted of primary signal gratings with grating lines constituted of carrier (secondary) gratings. Explicit description has been of such marks with relatively short carrier period. Alternative arrangements include such marks with carrier gratings of relatively long period. The two gratings may be interposed so that routing is the responsibility of the primary grating.

What is claimed is:

1. Process comprising image projection whereby a pattern image of a pattern on an object body is focused on a target body by projection imaging with an object beam, in which the pattern image is aligned on the target body by an alignment process including position-sensing, position-sensing comprising illuminating a first mark on one body to produce a signal beam for projecting a mark image of the first mark on the second body, in which the position of the mark image is determined relative to a conjugate mark on the second body, and aligning the pattern image based on position-sensing characterized in that both marks include a grating, here designated "signal grating", in that at least one of the signal gratings is segmented so that segments are out of phase with each other, in that the grating periods of the mark image and the conjugate mark are harmonically related, in that at least one signal grating is combined with a carrier grating to produce a combined grating so that lines of one grating are constituted of lines forming the other grating, in that the signal beam is diffracted by the carrier grating so that the mark image is superimposed on the conjugate mark with signal gratings parallel, in that position-sensing includes detection of the relative degree of overlap for the two segments, and in that alignment corresponds with relative degree of overlap.

2. Process of claim 1 in which the first mark is on the object body, the signal grating of the first mark is combined with a carrier grating, and the grating periods of the conjugate mark and the mark image are equal.

3. Process of claim 2 in which the signal grating of the first mark is segmented.

4. Process of claim 3 in which a beam, formed by superimposing the image mark on the conjugate mark, here designated "composite beam", is directed to a detector.

5. Process of claim 3 in which the first mark is illuminated by multiple illumination beams of differing angle of incidence, individual illumination beams yielding segment-related information for different segments.

6. Process of claim 5 in which multiple illuminating beams are produced by a single light source.

7. Process of claim 6 entailing time-multiplexing, in which the single-light source is modulated so as to produce multiple sequential illuminating beams.

8. Process of claim 7 in which the source is modulated by an acousto-optic deflector.

9. Process of claim 8 in which a single detector is used for detection.

10. Process of claim 1 in which the target is aligned and in which alignment corresponds with equal overlap for each of the two segments, any divergence from equality constituting an "error signal".

11. Process of claim 10, in which the first mark is on the object body, the signal grating of the first mark is combined with a carrier grating, and the grating periods of the conjugate mark and the mark image are equal, the process entailing time-multiplexing, in which position-sensing information for the two segments is sensed sequentially, and in which the error signal is sensed as the output of a single photodetector.

12. Process of claim 1 in which the two segments are out of phase by at least 10°.

13. Process of claim 12 in which the segments are out of phase by approximately 90°.

14. Process of claim 1 in which marks are directly printed on the bodies.

15. Process of claim 1 in which a mark includes more than one signal grating.

16. Process of claim 15 in which a mark includes orthogonal signal gratings.

17. Process of claim 15 in which a mark includes multiple interleaved signal gratings and carrier gratings, whereby spatial non-uniformity of illuminating light is averaged.

18. Process of claim 2 in which the grating periods of the carrier gratings for the two segments differ, in which carrier grating periods, upon illumination, yield a pair of collinear first-order diffracted alignment subbeams, the pair constituting a subbeam from each of the two segments.

19. Process of claim 1 comprising projection imaging of at least two objects with at least two image beams.

20. Process of claim 19 in which the two image beams are focused on substantially the same position of the target.

21. Process of claim 19 in which the two image beams are focused on adjacent positions of the target.

22. Process of claim 1 comprising VLSI fabrication, in which the object comprises a reticle, the target comprises a wafer, and in which the pattern image prescribes fabrication of a device level.

23. Process of claim 22 comprising projection imaging of successive reticles prescribing fabrication of successive fabrication levels.

24. Process of claim 22 comprising projection imaging onto adjacent wafer positions whereby images are stitched to produce a larger combined image.

25. Process of claim 4 in which the composite beam comprises a satellite beam.

26. Process of claim 25 in which satellite beams relating to the separate segments are independently detected, and in which an R function is calculated to derive further position information, in which R is defined as the difference between the intensities of the two detected signals divided by the sum of the intensities of the two detected signals.

27. Process of claim 25 in which further position information includes z information, and in which the pattern image is aligned using z information.

28. Process of claim 1 in which the combined grating is a zero-pi grating, in which signal grating lines are constituted of first carrier gratings and in which second carrier gratings occupy spaces between signal lines, in which first and second carrier gratings are of equal period but are out of phase by 180°.

29. Process of claim 1 in which aligning is done in real time.

30. Process of claim 29 in which aligning lags position-sensing by a maximum of ½ second.

31. Process of claim 1 in which image projection proceeds concurrently with positioning.

32. Process of claim 31 comprising VLSI fabrication, in which the object comprises a reticle, the target comprises a wafer, in which the pattern image prescribes fabrication of a device level via exposure of a photo-sensitive material, and in which exposure proceeds concurrently with positioning.

33. Process of claim 32 comprising step-and-repeat exposure and in which exposure commences before the wafer has come to standstill.

34. Process of claim 1 comprising creation of a display.

* * * * *